United States Patent [19]
Kitaori

[11] Patent Number: 5,440,572
[45] Date of Patent: Aug. 8, 1995

[54] DIGITAL SIGNAL DECODING APPARATUS AND A METHOD THEREOF HAVING A FUNCTION OF INITIALIZING A PASS METRIC FOR AT LEAST ONE COMPRESSION BLOCK

[75] Inventor: Shoji Kitaori, Kawasaki, Japan

[73] Assignee: Kabushiki Kaisha Toshiba, Kawasaki, Japan

[21] Appl. No.: 309,900

[22] Filed: Sep. 20, 1994

[30] Foreign Application Priority Data

Sep. 20, 1993 [JP] Japan .................................. 5-232867

[51] Int. Cl.6 ............................................. H0j1 13/12
[52] U.S. Cl. ...................................... 371/43; 341/107
[58] Field of Search ............... 371/43, 5.5, 37.1, 30.55; 455/10, 22, 63, 33.1; 360/51, 53, 46, 65, 45, 32, 13, 70; 375/112.25, 114.18, 116.39, 113.94; 370/18, 105.1, 110.1, 110.4; 341/94, 59, 107

[56] References Cited

U.S. PATENT DOCUMENTS

| | | | |
|---|---|---|---|
| 5,128,942 | 7/1992 | Kojima | 371/5.5 |
| 5,270,876 | 12/1993 | Inoue et al. | 360/46 |
| 5,276,709 | 1/1994 | Kazawa et al. | 375/25 |
| 5,295,142 | 3/1994 | Hatakeyama | 371/43 |
| 5,357,524 | 10/1994 | Shimpuku et al. | 371/43 |
| 5,369,671 | 11/1994 | Yehushua et al. | 375/94 |
| 5,377,133 | 12/1994 | Riggle et al. | 364/736 |
| 5,377,194 | 12/1994 | Calderbank | 370/110.1 |
| 5,381,276 | 1/1995 | Choi | 360/51 |

Primary Examiner—James P. Trammell
Attorney, Agent, or Firm—Oblon, Spivak, McClelland, Maier, & Neustadt

[57] ABSTRACT

A digital signal decoding apparatus includes a maximum-likelihood decoding portion in which a digital signal consisting of compression block data obtained by compressing every plurality of digital data units is subjected to maximum-likelihood decoding, thereby to output a maximum-likelihood decoded digital signal. A detection portion receives a maximum-likelihood decoded digital signal from the maximum-likelihood decoding means and detects at least one compression block data unit, thereby to output a predetermined control signal. An initialization portion initializes maximum-likelihood information used for the maximum-likelihood decoding by the maximum-likelihood decoding means, to a predetermined value on the basis of the control signal outputted from the detection portion.

14 Claims, 9 Drawing Sheets

DIGITAL SIGNAL DECODING APPARATUS AND A METHOD THEREOF HAVING A FUNCTION OF INITIALIZING A PASS METRIC FOR AT LEAST ONE COMPRESSION BLOCK

BACKGROUND OF THE INVENTION

1. Field of the Invention

The present invention relates to a digital signal decoding apparatus and a method thereof, for use in a digital communication apparatus including a satellite or an optical submarine cable, and a digital recording/reproducing apparatus using a digital VTR, a digital video disc, or the like.

2. Description of the Related Art

In relation to a digital signal decoding apparatus, a Viterbi decoding method is one of maximum likelihood decoding methods which make a full use of information included in a signal. This method is conventionally used as a detection method on which various studies and researches have been made mainly in the filed of digital communication using a satellite, a submarine cable and the like. Meanwhile, in relation to a digital VTR or a digital video disc, it is necessary to increase the recording density since a digital signal used in these digital recording medium must include an extremely large amount of data which is as several times as large as the data amount of an analogue signal. Such a communication apparatus or recording/reproducing apparatus using high technologies, a received or reproduced signal has a very low S/N ratio, and it is therefore very difficult to use a conventional method of decoding signals for every one bit. Hence, it is required to decode a signal by making a full use of data included in the signals of low S/N ratios as much as possible. Particularly, the Viterbi decoding method stated above attracts public attention since the S/N ratio can practically be raised for about 3 dB by using this method.

As a simple example of the Viterbi decoding method, application of this method to an NRZI method will be explained below.

Figure 6:
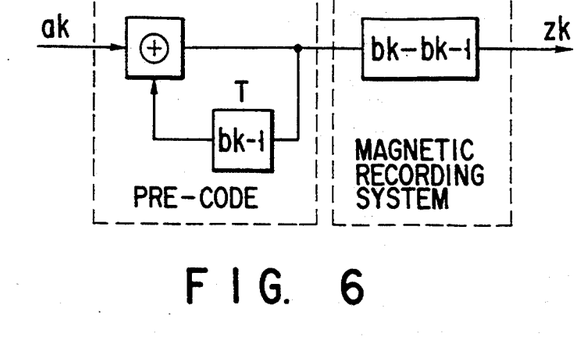
FIG. 6 is a block diagram showing an NRZI precode.

In an NRZI method, an exclusive OR operation value $b_k$ is prepared from an input signal $a_k$ and a delay signal $b_{k-1}$, as shown in a pre-code block shown in FIG. 6, and the operation value is recorded into a magnetic recording device.

$$b_k = a_k (+) b_{k-1} \quad (1)$$

When this value is reproduced, a reproduction signal $z_k$ is obtained by $b_k - b_{k-1}$ since a magnetic recording system has a differential characteristic. The signal system of this reproduce signal have two states, i.e., $S_k = \{+1, -1\}$ exists.

$$z_k = b_k - b_{k-1} \quad (2)$$

Figure 7:
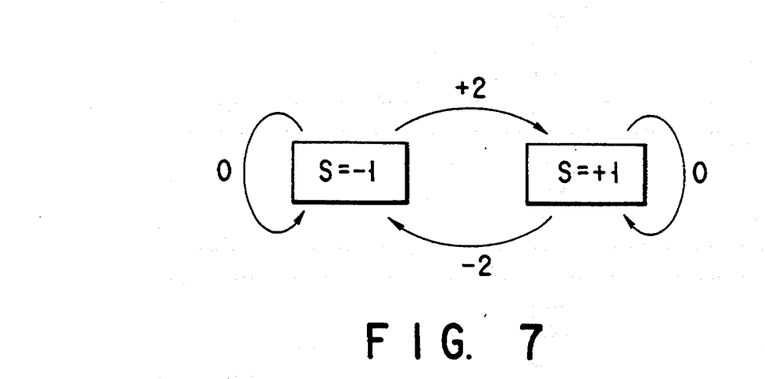
FIG. 7 shows a state shift in NRZI decoding.

This equation can be expressed as FIG. 7 in form of a state shifting view. When the reproduction signal z is +2, the state S shifts from −1 to +1; when the reproduction signal z is −2, the state S shifts from +1 to −1;, and when the signal z is 0, the state does not shift. Where noise is not included in a reproduction signal, a signal $z_k$ detected herefrom is one of −2, 0, and +2, i.e., a relation of $z_k = \{-2, 0, +2\}$ exists, and therefore, shift of the state takes place in determined courses. However, a signal $Y_k$ which is obtained by actual detection includes noise $n_k$.

$$y_k = z_k + n_k \quad (3)$$

If the noise forms a Gaussian distribution, maximum likelihood decoding can be carried out by supposing that a reproduction signal $z_k$ which minimizes an Euclidean distance of $(Y_k - z_k)^2$ has already been supplied. The maximum value of the sum of each minus Euclidean distance, i.e., $\{-(\text{Euclidean distance})\}$, up to a time k at which the state j appears is called a metric (or maximum likelihood) of the state j, which is expressed as $L_k{}^j$. When a metric $L_{k-1}{}^i$ is obtained in a state i at a time $k-1$, the metric $k^j$ in a state j at a time k is expressed by the following equation.

$$L_k{}^j = max\{L_{k-1}{}^i - (y_k - z_k{}^{ij})^2\} \quad (4)$$

Figure 8:
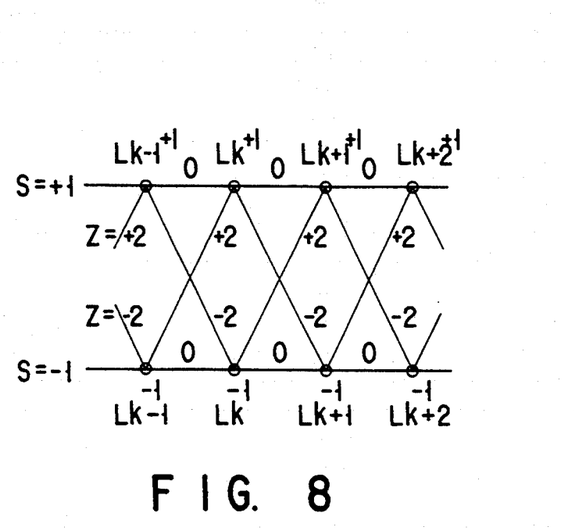
FIG. 8 is a trellis chart showing NRZI decoding.

Here, the only one shift which occurs from the state i at time $k-1$ to the state j at time k and which gives the value $L_k{}^j$ is stored as a "remaining pass" which generates the highest maximum likelihood, i.e., the highest "probability", and this process is cyclically performed in the Viterbi decoding method. In the case of an NRZI method where the number of states is two, relations of i (or j) = (+1, −1) and $z_k{}^{ij} = \{+2, 0, -2\}$ are obtained (where $z_k{}^{ij}$ is used as a reference). These relations are illustrated in form of a trellis chart in FIG. 8.

Thus, a Viterbi decoding method realizes maximum likelihood decoding by which a signal can be decoded depending on a detected signal system which is apart from the signal at the smallest distance and which therefore has the highest probability, so that it is possible to achieve decoding of signals which is less influenced by noise. As a result of this, application of this method into devices of low S/N ratios, such as, a digital recording/reproducing apparatus and the like can be very effective.

Figure 9:
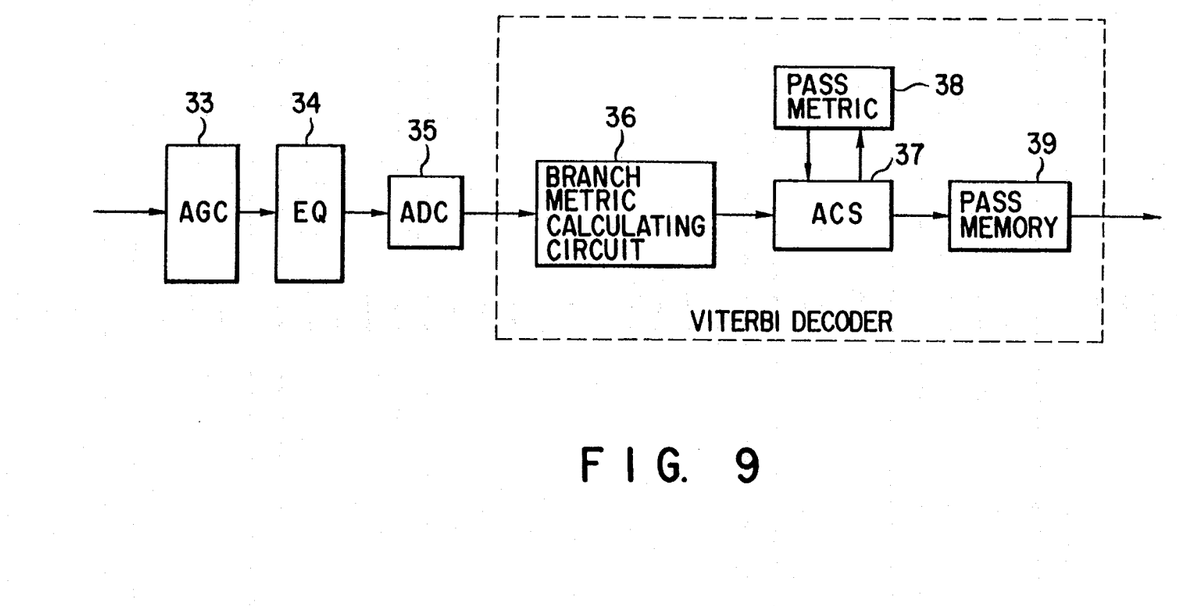
FIG. 9 is a block diagram of a conventional Viterbi decoder.

FIG. 9 is a block diagram showing the structure of a conventional Viterbi decoding apparatus. In this figure, a signal reproduced by a reproduce device is controlled to have a constant amplitude by an automatic gain control device (AGC) 33. Thereafter, the signal is subjected to waveform equalization by an equalizer (EQ) 34 and is then quantized by an analogue/digital converter (ADC) 35. Digital data thus processed is subjected to a calculation to obtain an Euclidean distance (or branch metric) for every shift by means of a branch metric calculation circuit 36.

In the next, an adder comparator selection circuit (ACS) 37 selects the following pass metric ($L_k$), in accordance with the formula (4) described below by using the Euclidean distance and a pass metric ($L_{k-1}$) of a pass metric memory 38, thereby updating the pass metric and simultaneously recording remaining pass data thus selected, into remaining pass memory means (or pass memory) 39. This pass memory can memory a state shift for a predetermined bit length, and determines a shift state by referring back to past data when a state shift occurs, so that a decoded signal can be outputted. Therefore, an outputted decoded signal may be delayed for a bit length equivalent to the bit length of data which can be stored in the pass memory.

Meanwhile, a pass metric, i.e., the maximum likelihood data used for determining a pass is sequentially changed and stored, and is used again to determine the next pass. In this respect, a Viterbi detection method is different from a conventional detection method in which only the amplitude data at a particular time is used for decoding, and a code series having the highest probability on a time series can be selected by the Viterbi detection method.

However, it will be easy to estimate that, when a pass metric has been greatly changed due to some accidental trouble (which is called a diffusion of the pass metric), such a diffusion will greatly influence on successive decoding to be carried out thereafter. A communication apparatus or a recording/reproducing apparatus of high technologies is frequently used in a situation where a phenomenon like a diffusion of a pass metric often occurs. For example, in a communication system which receives a weak radio wave signal, it is difficult to completely eliminate troubles due to disturbance radio waves which irregularly enter into the system. Or in a digital VTR in which a tape-like recording medium is scanned by a rotation head mounted on a rotation drum, thereby to reproduce a signal, a phenomenon called a drop-out frequently occurs due to damages on the recording medium and a signal is thereby suddenly lost. Therefore, a conventional method requires initialization of a pass metric at a predetermined optimal constant time cycle.

In recent years, a moving image compression method using digital signal processing techniques has been remarkably developed, and attempts to broadcast a large quantity of digital images and to record digital moving images for a long time period have been made by applying the moving image compression method into a digital communication apparatus or a digital recording/reproducing apparatus. Various methods have been proposed as the moving image compression method, and are typically represented by a method which belongs to a so-called block coding variable length compression method. In this method, coding is performed for every small pixel block, and the length of a code is variable in accordance with the data quantity of a small pixel block, so that image compression can be effectively carried out. However, when the compressed block data is transmitted or recorded, and a received signal or a reproduced signal is decoded by a Viterbi decoder, processing for expanding signals after receiving or reproducing the signals is carried out for every compression block, and a diffusion of a metric caused by disturbance signals or a drop-out influences a block next to the compression block which is being subjected to the expansion processing. Therefore, there is a problem that data of blocks which are not concerned with the block influenced by a fault like a diffusion of a metric cannot correctly decoded. In a method in which a metric is initialized at a predetermined time cycle, blocks arbitrarily have various lengths after compression processing, and initialization of a metric therefore may starts in the middle of one compression block, so that sufficient effects for preventing transference of metric diffusion to other blocks cannot be expected. In this respect, it is obvious maximum likelihood decoding cannot be fully effected if the initialization cycle is shortened.

As has been described above, in the Viterbi decoding, a maximum likelihood is calculated from amplitude data obtained at each sampling point, and a data system having the highest likelihood is outputted. However, since only the amplitude data concerning sampling points is used, it would be obvious that outputs are easily influenced by changes in amplitude levels caused by factors other than general noise. This phenomenon is explained in detail in "Digital Video Recording Techniques", page 81, issued by Nikkan Kogyo Shinbun-Sha.

A VTR is a system which brings about changes in reproduction signal level. One of main factors which cause changes in reproduction signal level is a track offset. A track offset occurs since a trace on a tape scanned by a head during recording does not correspond to a trace scanned during reproduction. Therefore, a track offset tends to frequently occur when the same apparatus as used for recording is not used for reproduction or when a tape which has led to changes on the passage of time is reproduced. However, such changes in reproduction amplitude level can be removed with ease by means of an AGC (or automatic gain control circuit) or the like since these changes appear at a relatively long time cycle in accordance with rotation of a head.

Another significant factor which cause changes in reproduction signal level is a clearance space between a tape and a head, i.e., a spacing change. In a VTR, although scanning is performed with a tape and a head being maintained in contact with each other to reproduce a signal, a slight spacing exists between the tape and head because of surface roughness of the tape. The spacing sensitively changes in response to surface conditions or vibrations of a tape, and makes significant influences on the signal amplitude. A drop of the reproduction signal amplitude is called a spacing loss, and logically follows the formula described below.

$$\text{Spacing loss} = 54.6 * d/\lambda [dB] \qquad (5)$$

(where d denotes a spacing and $\lambda$ denotes a recording wavelength: a quotation from "Logic of Magnetic Recording", Asakura-Shoten.) It is apparent that a drop in signal amplitude is an exponential function of a spacing and is more greatly effected as the high density recording is carried out with a shorter recording wavelength. It is also apparent from causes of a spacing loss that changes due to a spacing loss occurs at an extremely short cycle. Therefore, with use of a feed back circuit which requires a long convergence time, such as an AGC used for removing changes in amplitude due to track offsets, removal of changes in amplitude occurring at a short cycle is impossible.

Further, changes in spacing result in changes in frequency characteristic. A change in frequency increases equalization errors and causes various errors. In this respect, various developments have conventionally been made to obtain automatic equalizing circuits in which an equalization characteristic is automatically changed such that an equalization error can be converged to be extremely small. These automatic equalizing circuits are naturally used together with a Viterbi detection circuit, and in this case, changes in amplitude can be automatically corrected. However, such an automatic equalizing circuit cannot function to follow changes in frequency characteristic at a cycle shorter than a time required for convergence as far as the circuit is a kind of feed back circuit.

Thus, an AGC circuit or an automatic equalizing circuit does not at all function to respond to immediate changes in reproduction amplitude caused by spacing changes in a VTR, which is a factor rendering a maximum likelihood decoding circuit less functional in a high density digital VTR.

SUMMARY OF THE INVENTION

Therefore, the object of the present invention is to provide a digital signal decoding apparatus and a method thereof which is capable of preventing a sudden fault occurring at a block from influencing adjacent blocks, with ensuring advantages of conventional decoding methods.

To achieve the above object, a digital signal decoding apparatus according to the present invention comprises maximum-likelihood decoding means for maximum-likelihood decoding a digital signal consisting of compression block data obtained by compressing digital data for every plurality of digital data units, and for outputting a maximum-likelihood decoded digital signal, detection means for receiving the maximum-likelihood decoded digital signal from the maximum-likelihood decoding means, for detecting at least one compression block data unit, and for outputting a predetermined control signal, and initialization means for initializing maximum-likelihood information used for the maximum-likelihood decoding by the maximum-likelihood decoding means, to a predetermined value on the basis of the control signal outputted from the detection means.

Further, the digital signal decoding method of the present invention comprises a maximum-likelihood decoding step of maximum-likelihood decoding a digital signal consisting of compression block data obtained by compressing digital data for every plurality of digital data units, and of outputting a maximum-likelihood decoded digital signal, a detection step of receiving the maximum-likelihood decoded digital signal decoded in the maximum-likelihood decoding step, of detecting at least one compression block data unit, and of outputting a predetermined control signal, and an initialization step of initializing maximum-likelihood information used for the maximum-likelihood decoding in the maximum-likelihood decoding step, to a predetermined value on the basis of the control signal.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

In the following, embodiments of the present invention will be specifically described with reference to the drawings.

At first, a first embodiment of the present invention will be schematically explained. In this first embodiment, a Viterbi detector is provided with a pass metric initializing means, and a detection signal having a predetermined specific pattern is transmitted or recorded such that compressed data is received or reproduced for every one compression block or for every plurality of compression blocks, thereby to initialize a pass metric in response to the detection signal of a specific pattern or to a compression block data detection signal.

In order that a received signal or a reproduction signal is correctly decoded with use of an initialized pass metric when a pass metric is initialized, a given bit column having a predetermined length is decoded following the specific pattern or a Viterbi decoder is provided with an input buffer and an output buffer.

Therefore, when a variable length compression is carried out, the pass metric can be initialized for every compression block or every plurality of compression blocks, and a diffusion of the pass metric due to a sudden fault such as a drop-out or the like can be completely prevented from influencing adjacent blocks, while maintaining effects of Viterbi detection.

In a second embodiment, an amplitude which corresponds to a data bit is picked up from a reproduced signal equalized in accordance with a predetermined equalization method, and also, an adjacent signal amplitude which is smaller than a data bit interval is picked up. A well-known correlation is applied between both amplitude to immediately correct changes in frequency characteristic.

As a result, it is possible to correct an immediate change in frequency characteristic which cannot be corrected by a conventional feed back circuit such as an AGC circuit or an automatic equalizing circuit, and to provide a decoder capable of performing optimal maximum likelihood decoding.

The embodiments as schematically explained above will be described in more details with reference to the drawings.

Figure 1:
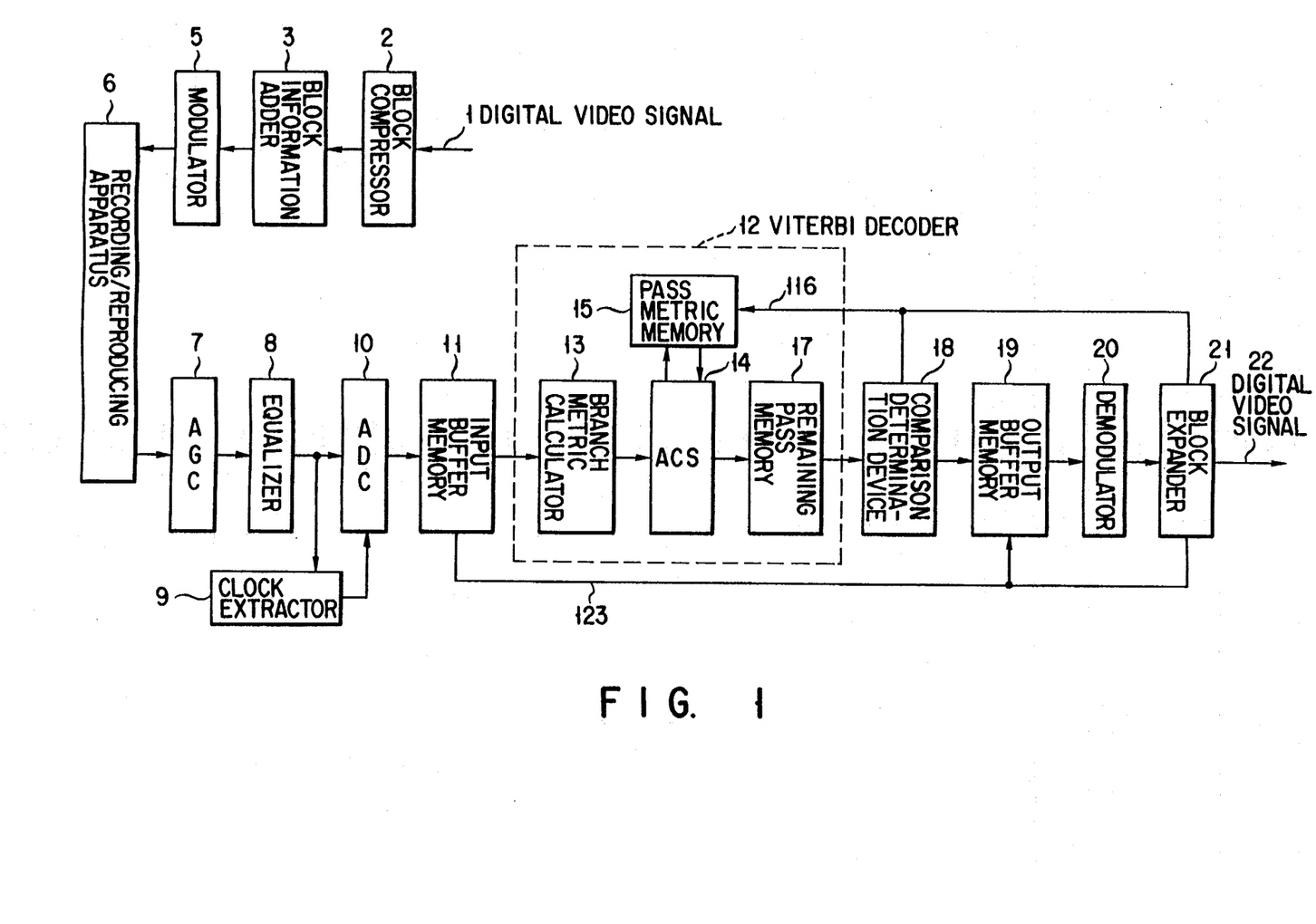
FIG. 1 is a block diagram of a digital recording/reproducing apparatus according to a first embodiment of the present invention.

FIG. 1 is a block diagram showing a digital signal decoding apparatus according to the first embodiment of the present invention. Although a block compression digital recording/reproducing apparatus is dealt with in this embodiment, this recording/reproducing apparatus may be replaced with a transmission/receive apparatus and thus, the first embodiment is, of course, applicable to a digital communication apparatus.

In FIG. 1, a digital video signal 1 is compressed for every block consisting of a plurality of image data items by a block compressor 2, and is then added with necessary data for every compression block by a block data adder 3, thereby generating a digital compression data signal 4. This signal 4 is converted by a modulator 5, so as to have a signal characteristic suitable for the characteristic of a recording/reproducing apparatus 6. This embodiment adopts a run-length limited code RLL (2, 3) modulator which restricts a sequential common bit length to a range of 2 to 7. The signal thus converted is recorded onto a recording medium by the recording/reproducing apparatus 6.

Figure 2A:
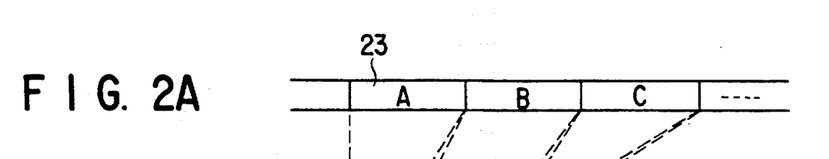
FIGS. 2A to 2E are charts showing a compression process according to the present invention.
Figure 2B:
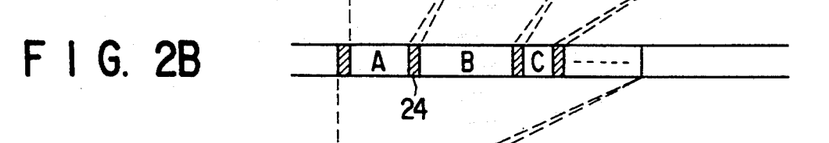

States of compression carried out in the above manner are shown in FIGS. 2A to 2E. A digital video signal 1 is divided and compressed into data blocks 23 each having a predetermined constant length (FIG. 2A). A compressed data block (or compression block) has a length variable depending on the quantity of data, and in order to divide the digital signal 1, a data column 24 for storing data-length information or a position on an original video image is added to every compression block (FIG. 2B).

Figure 2C:
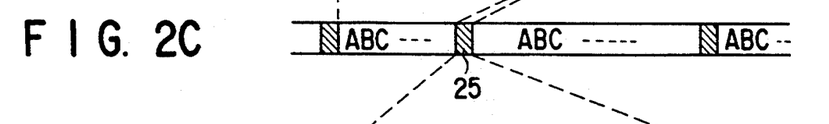
Figure 2D:
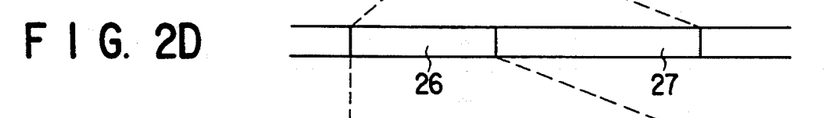
Figure 2E:
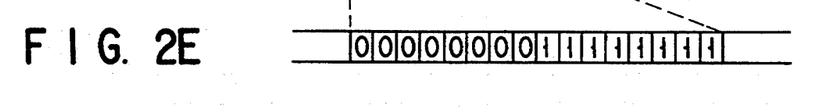

A metric initializing data column 25 is added to every plurality of compression blocks (FIG. 2C). An add data column 25 consists of a specific bit pattern 26 and a given bit pattern 27 (FIG. 2D). As shown in FIG. 2E, a specific bit pattern 26 uses a 16-bit pattern consisting of a sequence of eight "0" and a sequence of eight "1. This bit pattern is not generated by the RLL (2, 3) modulator, and therefore, can be relatively easily detected and distinguished from image information data. Off course, this pattern is not modulated, but is directly recorded. This pattern may be added after modulation.

Figure 3A:
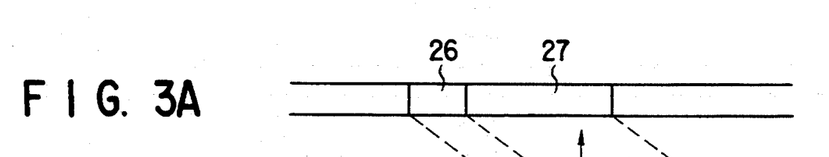
FIGS. 3A and 3B are views which explains decoding when a specified bit pattern is applied, according to the first embodiment of the present invention.
Figure 3B:
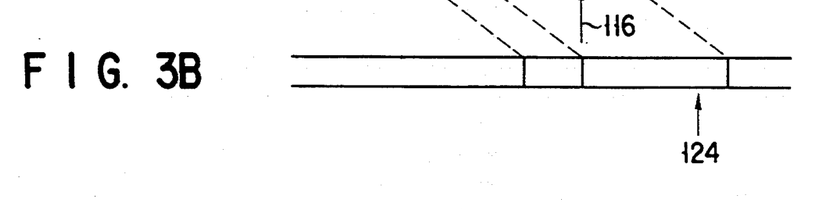

FIGS. 3A and 3B show the reasons why arbitrary bit pattern 27 is necessary. FIG. 3A shows a reproduction signal column. On the other hand, a decode signal column shown in FIG. 3B produces a time delay at least corresponding to a data-length stored in a pass memory of the Viterbi decoder. Therefore, when a specific bit pattern 26 is detected and a metric initialization control signal 116 is generated as an external control signal after decoding, a calculation for a pass metric immediately after the specific bit pattern 26 has already been completed, but a calculation using an initialized metric is not yet carried out. Accordingly, the data column immediately after the specific bit pattern 26 used for initialization of a metric has a low reliability, and therefore, it is desirable to insert a given bit pattern 27 in place of video information data, into a portion of this data column. However, different application of the given bit pattern is possible. For example, any other information than the image information data, e.g., photographing data such as date or data used for edit operation may be repeatedly recorded into the given bit pattern 27.

Referring back to FIG. 1, the flow of a signal after reproduction operation in the embodiment will be explained below. A signal reproduced by a recording/reproducing apparatus 6 is an analogue signal which causes an interference between codes due to the frequency characteristic during a recording/reproducing process and is added with noise. This analogue reproduction signal is firstly amplified to have a suitable amplitude by an automatic gain control apparatus (AGC) 7, and thereafter, the interference between signals is reduced by compensating for the frequency characteristic during the recording/reproducing process by using an equalizer 8. From this signal, a clock timing for the signal itself is extracted by a phase locked loop (PLL) 9 used as a clock extractor, and an analogue/digital converter (ADC) 10 samples an analog signal on the basis of the extracted clock timing, thereby convert the signal so as to coincide with the digital signal system.

Reference numeral 11 denotes an input buffer memory. This memory stores a sequence of digital signals inputted into a Viterbi decoder 12 in a rear stage for a predetermined time period, and can re-input a sequence of digital signals preceding for a predetermined time period in response to an external control signal 123. This role of the memory will be specifically explained later.

Reference numeral 12 shows a basic structure of a Viterbi decoder which is used as a maximum likelihood decoder in this embodiment. This decoder has the same function as a conventional Viterbi decoder. Reference numeral 13 denotes a branch metric calculator for calculating a branch metric for a digital signal sequence, and reference numeral 14 denotes an addition comparison determination system (ACS) for calculating and determining a next pass metric expressed above by the formula (4). Reference numeral 15 denotes a pass metric memory for storing a pass metric used for calculations performed by the ACS 14 and this memory includes an initialization means for initializing the pass metric to a predetermined value with use of a metric initializing control signal 116. Reference numeral 17 denotes a remaining pass memory for storing a remaining pass determined by the addition comparison determination system 14, and performs encoding by tracing back remaining passes stored when it is determined that a state shift occurs.

Reference numeral 18 denotes a comparison determination system for making a comparison with a predetermined signal sequence. This comparison determination system 18 stores a specific bit pattern 26 which has been mentioned above with reference to FIG. 2D, and generates a metric initializing control signal 116 to initialize the pass metric memory 15 if an encode bit sequence corresponds to the specific bit pattern 26.

Reference numeral 19 denotes a buffer memory. This buffer memory stores, delays, and outputs an encoded bit sequence for a predetermined time period. The buffer memory 19 is capable of deleting a part of the bit sequence to be stored and then re-storing the bit sequence, by using a buffer memory control signal as an external control signal. This functional role will be specifically explained later in combination with the input buffer memory 11 and the Viterbi encoder 12.

An encoded signal is demodulated by a demodulator 20 to form compression block data. This compression block data is expanded in units of compression blocks by a block expander 21 to form original video signal data which constitutes digital image data 22. In this stage, the block expander 21 detects a partition between compression blocks on the basis of data column 24 added to information in units of compression blocks (FIG. 2B), and generates a metric initialization control signal 116 and a buffer memory control signal 123. Next, the functional roles of these control signals and the buffer memory will be explained.

Figure 4:
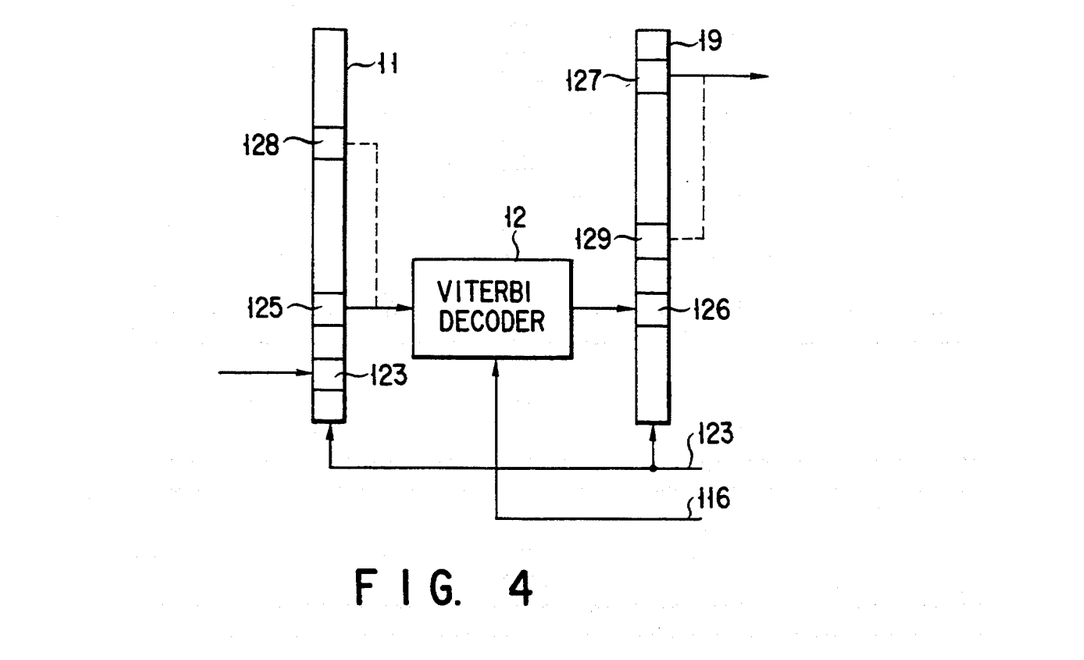
FIG. 4 is a view showing the operation of an input/output buffer according to the first embodiment of the present invention.

FIG. 4 illustrates the functional roles of an input buffer memory 11 and an output buffer memory 19 respectively provided in front and rear stages of a Viterbi decoder 12. A sampled digital signal sequence is stored at a predetermined position 124 in the input buffer memory 11, and the storage position is updated to a lower position in the figure. The Viterbi decoder 12 reads data from a predetermined position 125 in the input buffer memory 11, and this position is also updated to a lower position in the figure. A decoding result is temporarily stored into a predetermined position 126 in the output buffer memory 19, and the storage position is updated to a lower position in the figure. Then, a decoding result of a predetermined position 129 delayed from the above decoding result is outputted. Normally, pointers indicating respective positions are uniformly increased or decreased, thereby to cyclically indicate memories, and therefore, the buffer memories 11 and 19 merely serve to slightly delay data. However, when a buffer memory control signal 123 is generated in synchronization with the above-mentioned metric initialization control signal 116, the output position of the input buffer memory 11 moves back to a position 128 from the current position 125 for a predetermined time period. On the other hand, the input position of the output buffer memory 19 does not move from the current position 126 for a predetermined time period, while the output position of the output buffer memory 19 moves from a position 1227 to a position 129.

Figure 5A:
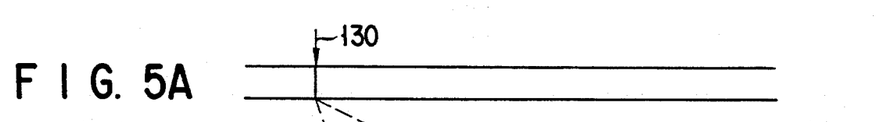
FIGS. 5A to 5D are views which explains decoding where an input/output buffer according to the first embodiment of the present invention is used.
Figure 5B:
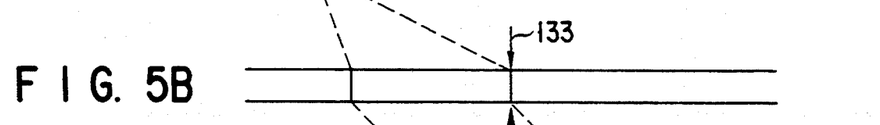
Figure 5C:
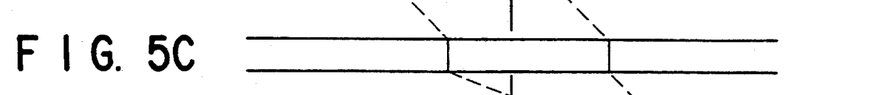
Figure 5D:
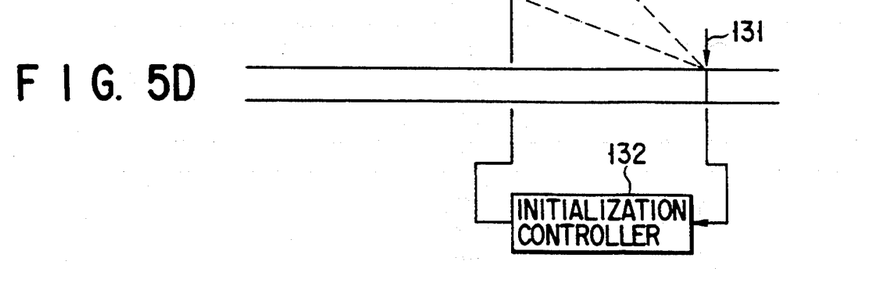

FIGS. 5A to 5D are charts illustrating the initializing process as stated above which uses buffer memories. FIG. 5A shows an input sequence of the buffer memory 11. FIG. 5B shows an input signal sequence of a Viterbi decoder 12. FIG. 5C shows an output signal sequence of the Viterbi decoder 12. FIG. 5D shows an output sequence of the output buffer memory 19. Reference numeral 130 denotes a partition of a compression block or a specific pattern position explained above, and the pass metric is desirably initialized from this position. However, the position of a partition of a compression block decoded for processing of input and output buffer memories 11 and 19 and a Viterbi decoder 12 or the position of a specific bit pattern serves as a timing for an output sequence (FIG. 5D) after a relatively long delay. If this timing is detected by an initialization detector 132 which serves as a block expander 21 or a comparison determination system 18, to generate only a pass metric initialization control signal 116, processing will normally be too late.

However, if a buffer memory control signal 123 is sent to an input buffer 11 by the initialization detector 132 and the Viterbi decoder 12 can receives a re-input at a timing 133 shown in FIG. 5B from data preceding for a predetermined time period, a pass metric calculation using an initialized metric can be achieved. Data thus re-decoded is delayed from information motivating initialization of a pass metric such as a specific bit patter or a partition of compression block data as mentioned above. However, since the output buffer 19 does not update an input pointer, i.e., since input operations required for updating input pointers are reduced, outputs from the output buffer memory 19 can be kept continued and decoding results obtained by using a pass metric initialized from data immediately after a specific bit pattern or a partition of a compression data block.

In the above-mentioned means, problems as stated above can be avoided by decoding an arbitrary bit pattern 27 having a predetermined length, following decoding of a specific bit pattern 26. Although this is a simple method, the recording density is more or less degraded so that this method cannot be frequently used. However, initialization of a metric for every compression block is realized by using buffer memories, and a diffusion of a metric is prevented from being transferred between compression blocks. Further, in addition to initialization of a metric for every compression block, initialization of a metric is carried out by recording a specific bit pattern and an arbitrary bit pattern following the specific bit pattern for every large block unit consisting of a plurality of compression blocks, and input and output positions of input and output buffer memories 11 and 19 are initialized in accordance with control signals not shown. Therefore, it is possible to prevent data from over-flowing from the buffer memories.

The capacity required for a buffer memory is decided by multiplying the number of times, for which initialization of a pass metric is carried out until the buffer memory is initialized, by at least the size of a pass memory of a Viterbi decoder. Therefore, by adding a specific bit pattern for initializing the buffer memory in accordance with the number of times for which the pass metric is initialized for every compression block, the buffer actually does not cause over-flow.

The frequency at which pass metric initialization is carried out depends on the characteristic of a recording-/reproducing system. Specifically, if a pass metric diffusion caused by a sudden fault such as a drop-out is small or converges within a range of one compression block with a high provability, initialization for every several blocks is effective. In addition, if one compression block is divided into several blocks in accordance with a recording format, it is possible to initialize the pass metric for every divided block. Further, occurrence of errors can be restricted by generating a pass metric initialization control signal in accordance with an error occurrence state obtained through a process for correcting an error on the basis of an error correction coded normally added.

Figure 10:
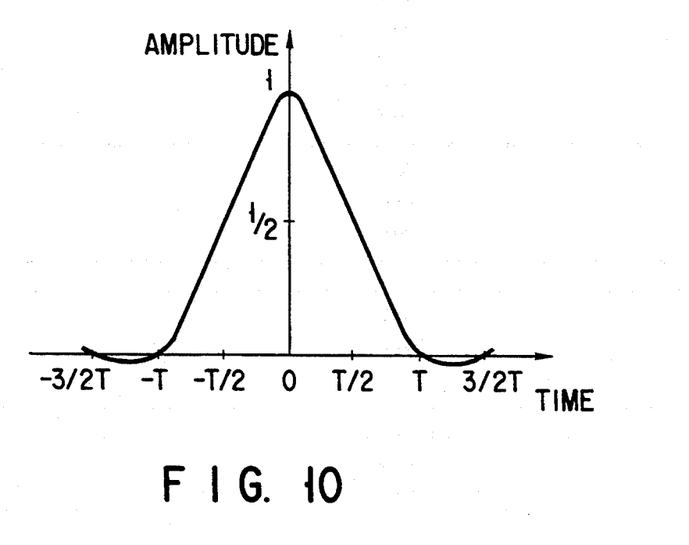
FIG. 10 shows an example of an equalization characteristic according to a second embodiment of the present invention.

In the following, a second embodiment of the present invention will be explained. At first, a principle applied to the second embodiment will be described. A signal reproduced by a reproducing head is inputted into a Viterbi decoder 12 after interferences between codes are eliminated by an equalizer 8. FIG. 10 is a graph showing a waveform when an isolated reproduction wave is inputted into the Viterbi decoder 12 according to this embodiment. The horizontal axis denotes time standardized by an information bit interval. In a normal equalizer, equalization is carried out such that a level is substantially 0 at an identification point nT of an isolated reproduction wave (n is an integer other than 0) and that a reproduction wave at time 0 does not interfere with other identification time points. However, a wave inputted into the Viterbi decoder 12 of this embodiment has values other than 0 at identification points of a time 0 and times $\pm T/2$, as shown in FIG. 10, and has a value of substantially zero at another identification point nT/2 (n is not 0 or $\pm 1$). This equalization method is thus characterized in that, other than the original identification point (time 0), positions at which a wave has an effective value other than 0 exist at an interval smaller than an information bit interval. There may be various methods other than the above equalization method, which have the same characteristic and can be applied to the Viterbi decoder 12 of this embodiment.

Figure 11:
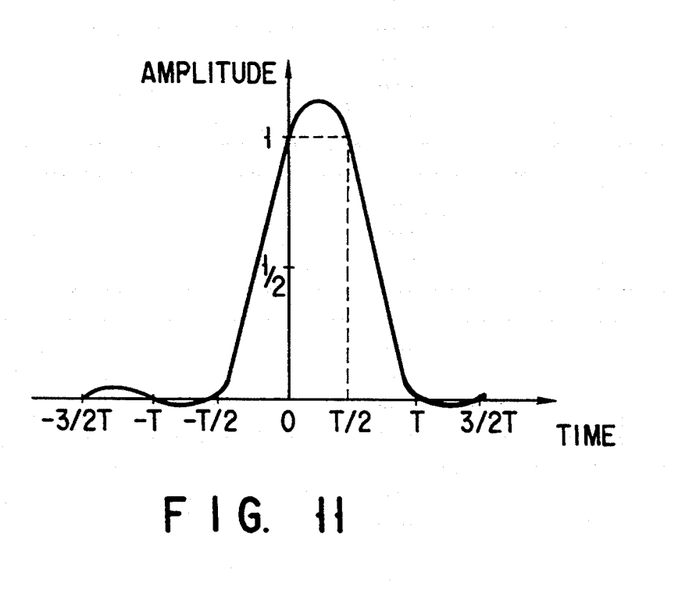
FIG. 11 shows an another example of an equalization characteristic according to an embodiment of the present invention.

FIG. 11 shows an isolated reproduction waveform after equalization according to another equalization method, which can be inputted into the Viterbi decoder 12 of this embodiment. This waveform is different from that shown in FIG. 10, and the wave has the same value at an identification point time 0 and at a point T/2, while the wave has a value of substantially zero at the other identification points of a T/2 interval. Differences between waveforms depending on equalization methods do not influence the principals of this embodiment, and therefore, any equalization method may be selected as long as the equalization method is suitable for the characteristic of a recording/reproducing system. In this embodiment, a transversal filter is used as an equalizer.

Figure 12:
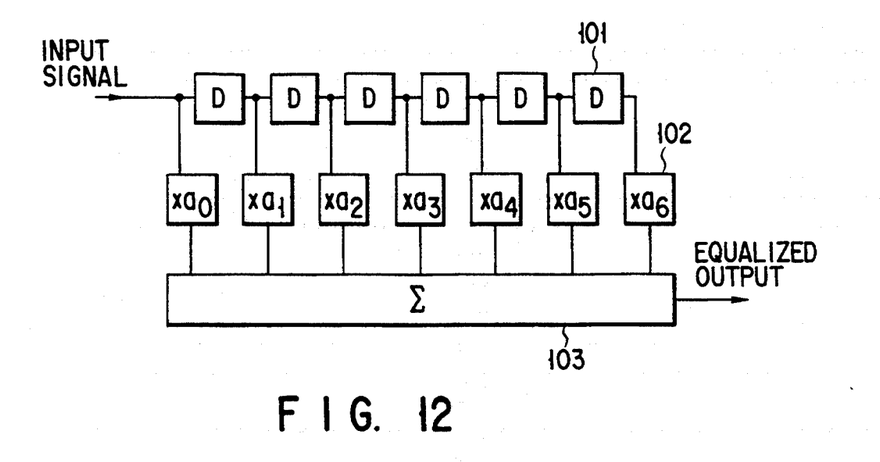
FIG. 12 shows a structure of a transversal filter.

FIG. 12 shows a block diagram of the transversal filter. The transversal filter comprises a plurality of delay elements (D) 101, a multiplication element 102 for extracting signals from between the delay elements and for subjecting the signals to amplification damping or multiplication with use of coefficients called tap coefficients, and an adder 10 for adding multiplication results to each other. Both of the equalization methods described above can be realized by adjusting the tap coefficient of the transversal filter. An response Z from the transversal filter is expressed in form of the following formula 6.

$$z = a0*f0 + a1*f1 + a2*f2 + a3*f3 + a4*f4 + a5*f5 + a6*f6 \quad (6)$$

In this formula, a0 to a6 are tap coefficients and f0 to f6 are amplitude values of reproduction signals delayed at interval time period D. If equalization conditions are substituted into terms of this formula and tap coefficients are obtained, it is possible to realize an equalizer which satisfies desired requisites.

In the Viterbi decoder 12 of this embodiment, not only an amplitude at an original detection position (time 0) but also amplitude information at an adjacent position (time T/2 or −T/2 in the example) which exist between the original position and a next detection position (time T or time −T) are used together to carry out decoding.

Figure 14A:
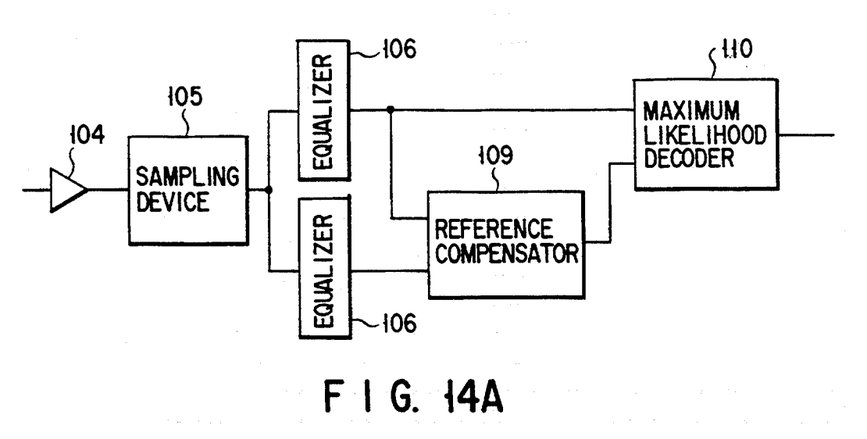
FIGS. 14A to 14C are block diagrams showing the structure of the second embodiment of the present invention.
Figure 14B:
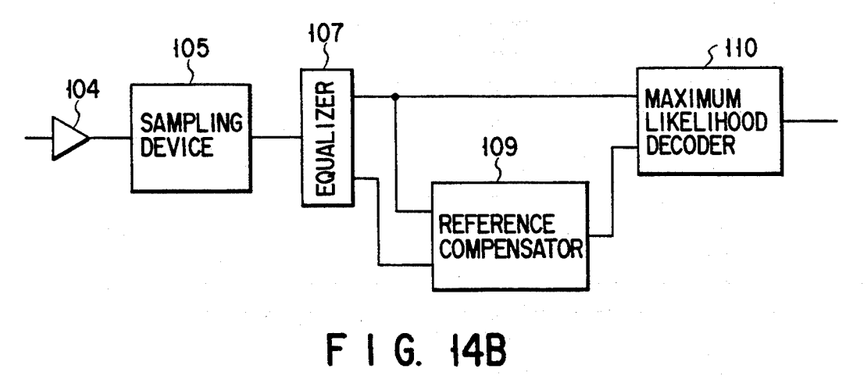
Figure 14C:
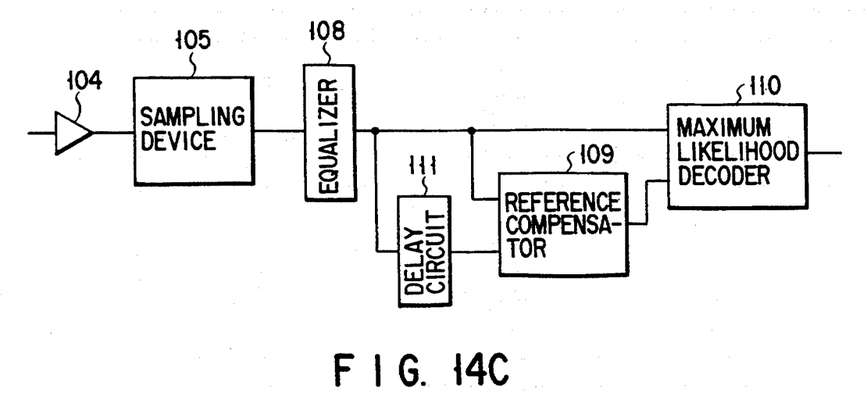

In this respect, three types of arrangements as shown in FIGS. 14A, 14B, and 14C may be used. Processes of amplifying a reproduction signal by an amplifier 104 and of sampling thereafter the signal as digital data by a sampling device 105 are common to each of these arrangements. Then, in the arrangement of FIG. 14A which uses two equalizers (or equalizing circuits) 106, through one of which an amplitude at the time 0 is extracted and through the other of which an amplitude at the time 2/T is extracted. These amplitudes are read by a frequency characteristic compensation circuit (or reference compensator) 109 and a reference level signal is generated in a manner which will be described later. The reference level signal is outputted to a maximum likelihood decoder 110. In this arrangement, two equalizers are required so that a circuit has a relatively large scale. However, this arrangement is advantageous in that an equalization method for extracting an amplitude at time 0 which is an original detection position can be set independently from another equalization method for extracting an amplitude used for compensation of a frequency characteristic. Therefore, a delay amount of T can be common to all the delay elements of both equalizers (whereby there must be a time difference smaller than the time T between inputs into the two equalizers or between outputs therefrom.)

Figure 13:
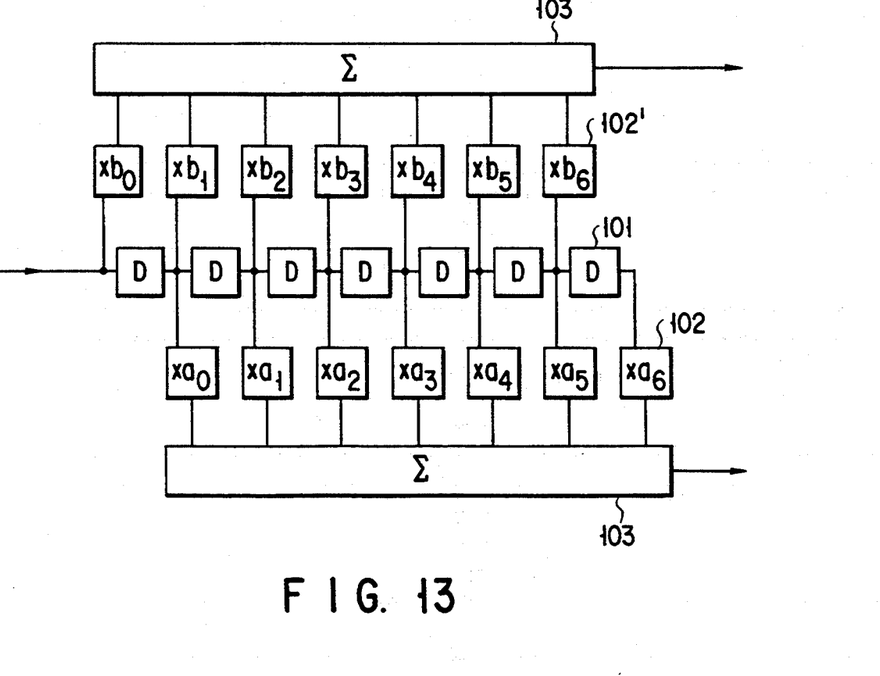
FIG. 13 shows another structure of a transversal filter.

Meanwhile, FIG. 14B illustrates a method in which amplitudes at different detection time points are extracted from one single equalizer 107. This method will be realized by preparing an equalizer 106 so as to have an arrangement as shown in FIG. 13. In this equalizer 106, a delay amount of a delay element 101 is T/22, and signals extracted from taps are equalized in such a manner in which signal timings are shifted by a transversal filter using two systems of tap coefficients (a and b). In this manner, amplitude information at an original detection position (time 0) and amplitude information at another detection position (time T/2) slightly shifted therefrom can be outputted at the same time. This arrangement is advantageous in that dispersion of characteristics can be reduced since the arrangement use common delay elements, and in that an actual equalization characteristic can be changed by setting a tap coefficient. However, this arrangement necessitates a large circuit size and it is therefore somewhat difficult to put it into practical use.

FIG. 14C shows an arrangement in which a delay circuit 111 for delaying a signal from one equalizer 108 for a predetermined time period is used to obtain amplitude information at a position shifted from an original detection position. Although this arrangement can be realized by the simplest circuit configuration, the same equalization method and equalization characteristic are used and does not allow any different selection.

Although the arrangement of an equalizer may be modified in other manners than those described above, it is essential to an equalizer that an amplitude at an original detection position and an amplitude at another detection position shifted from the original detection position for a time period shorter than an information bit interval T and that equalization is carried out in manners suitable for two amplitudes, respectively, so that a constant amplitude is expected for each of detection points. The following will be explanation to a correction method for a maximum likelihood decoder with use of two amplitudes.

A reproduction waveform can be approximated by a Loreritz waveform expressed below as a formula (7).

$$f(t) = 1/(1 + (t/D50)^2) \quad (7)$$

In this formula, D50 denotes a time interval with which the reproduction amplitude is ½, and is a parameter representing a frequency characteristic of a recording/reproducing system. The subject matter of this embodiment is immediate changes in frequency characteristic which can be taken as changes in D50. A tap coefficient of an equalizer optimized under a condition of using a certain frequency characteristic (D50=D0) satisfies the following formula (8).

$$\begin{bmatrix} f0 & f1 & f2 & f3 & f4 & f5 & f6 \\ f1 & f0 & f1 & f2 & f3 & f4 & f5 \\ f2 & f1 & f0 & f1 & f2 & f3 & f4 \\ f3 & f2 & f1 & f0 & f1 & f2 & f3 \\ f4 & f3 & f2 & f1 & f0 & f1 & f2 \\ f5 & f4 & f3 & f2 & f1 & f0 & f1 \\ f6 & f5 & f4 & f3 & f2 & f1 & f0 \end{bmatrix} \begin{bmatrix} a0 \\ a1 \\ a2 \\ a3 \\ a4 \\ a5 \\ a6 \end{bmatrix} = \begin{bmatrix} 0 \\ 0 \\ 1/2 \\ 1 \\ 1/2 \\ 0 \\ 0 \end{bmatrix} \quad (8)$$

In this case, the arrangement of an equalizer according to FIG. 14C is adopted because of its simplicity. The right side of the above formula indicates constant amplitude values expected from two detection points. When the value D50 of a reproduction waveform is changed due to a change in frequency characteristic caused by a spacing change as has been described before, an amplitude to be detected is not a constant of the right side any more. Where g is the reproduction waveform at this time point, an amplitude x to be detected satisfies the following formula (9).

$$\begin{bmatrix} g0 & g1 & g2 & g3 & g4 & g5 & g6 \\ g1 & g0 & g1 & g2 & g3 & g4 & g5 \\ g2 & g1 & g0 & g1 & g2 & g3 & g4 \\ g3 & g2 & g1 & g0 & g1 & g2 & g3 \\ g4 & g3 & g2 & g1 & g0 & g1 & g2 \\ g5 & g4 & g3 & g2 & g1 & g0 & g1 \\ g6 & g5 & g4 & g3 & g2 & g1 & g0 \end{bmatrix} \begin{bmatrix} a0 \\ a1 \\ a2 \\ a3 \\ a4 \\ a5 \\ a6 \end{bmatrix} = \begin{bmatrix} x3 \\ x2 \\ x1 \\ x0 \\ x1 \\ x2 \\ x3 \end{bmatrix} \quad (9)$$

When an equalization error is relatively small, x2 and x3 are extremely close to 0.

In a conventional method in which amplitude information at only one detection point is extracted, there is no method for determine whether a change in amplitude is caused by noise or by any other factor. Therefore, maximum likelihood decoding is carried out supposing that all the changes in amplitude are caused by noise, and as a result, a change in amplitude caused by a factor other than noise, for example, by a spacing change or the like directly disturbs the maximum likelihood decoding, thereby incurring an error. However, according to the present invention, amplitude information is detected at least at two positions including an original detection position and another detection position shifted therefrom. Of course, amplitude information obtained at any detection position are influenced by noise. However, if a change in amplitude is caused by a spacing change, the amplitude information at the original position and the other amplitude information at the shifted position have a correlation with each other in accordance with a change in frequency characteristic. With use of this correlation, a change in amplitude based on a change in frequency characteristic can be corrected, and a proper maximum likelihood decoding can be performed with respect to only noise.

Figure 15:
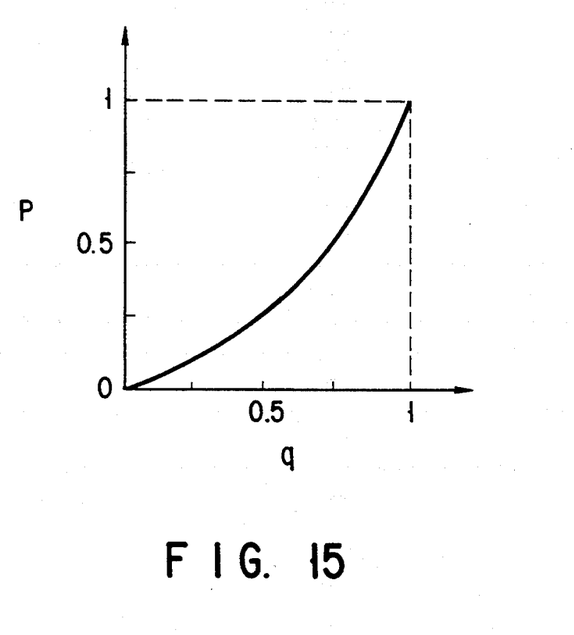
FIG. 15 is a figure showing a correlation between amplitude change ratios at two detection points.

FIG. 15 is a graph showing a relationship between a change rate p (x0) of an amplitude detected at an original detection position and a change rate q (2*x1) of an amplitude detected at a detection position shifted from the original detected position by T/2, where the frequency characteristic of a recording/reproducing system is changed, i.e., D50 is changed, in a fixed equalizer. Changes in amplitude thus detected at two positions have a constant relationship, and therefore, it is possible to obtain the value of D50 from the change rates and to correct a change in frequency with use of the value of D50. On the other hand, a relationship between amplitude change rates caused by noise, a band of which is limited at a lower frequency in comparison with the detection interval between the above two detection position, is substantially constant and uniformly shows uniform stochastic distributions in both of an increasing direction and a decreasing direction, which can be averaged thereby to eliminate influences. Therefore, influences of noise can be minimized when correction using amplitude change rates detected at two detection positions is carried out.

$$\xi = 2*x1/x0 \quad (10)$$

If a relationship with respect to an amplitude decreasing rate $\eta$ at a detection time point 0 using a waveform deformation rate $\xi$ defined by the above formula (10) is expressed as $\eta = f(\xi)$ using a function f, a suitable reference value estimated herefrom is $x0*\eta$. Therefore, if the maximum likelihood which serves as a probability in maximum likelihood decoding is equal to the level of the reference value thus corrected, an immediate change in frequency due to a spacing change or the like can be corrected.

In some cases, it may be suitable for a calculation of a correction maximum likelihood to use a recurrence formula depending on a certain weight n ($0 < n < 1$) in the meaning of averaging fluctuation caused by noise. Specifically, a correction reference value s' is updated by an operation which satisfying a relation of $s' = n*s + (1-n)*\eta*s$ with use of a preceding correction value s prior to the value s'. Correction of a reference level or updating thereof thus using a relationship function f between a waveform deformation rate $\xi$ and an amplitude decreasing rate $\eta$ is calculated by a reference level correction circuit as shown in FIGS. 14A, 14B, and 14C, and decoding is carried out by a maximum likelihood decoder on the basis of the correction reference level thus obtained.

Consideration has been made in the above with respect to an isolated reproduction wave (which is only one reproduction wave). However, it is possible to correct a reference level where a plurality of reproduction waves are overlayered on each other. The reasons which enable such correction will be described below.

As far as a certain information bit is concerned, an mutual interference of waveforms between the information bit and adjacent information bits preceding or following the information bit, i.e., an interference between codes is generally considered as causing a significant problem. Therefore, in order that a waveform of an information bit at a detection point does not influence waves at any other detection points, an equalizer is adjusted so as to satisfy a requisite that an isolated reproduction wave has a characteristic close to 0 at detection points other than the detection point of the information bit. An equalization characteristic necessary for the decoding method of this embodiment is arranged so as to satisfy the requisite, i.e., an amplitude is close to 0 during bit intervals between respective information bits except for a detection time point 0, which does not cause any problem. However, as has been explained above, when amplitude information having an interval shorter than a bit interval is used to immediately correct a change in frequency characteristic, a large waveform interference may occur at the detection point at which this amplitude information is detected.

For example, in the equalization characteristic cited above with reference to FIG. 10, an amplitude at a detection point of T/2 is expressed as five-value information consisting of $\pm 1$, $\pm \frac{1}{2}$, and 0 since this information is equally influenced from both adjacent information bits in both sides of the information bit at the detection point. Therefore, before a change in frequency is corrected, determination at this detection point is required, thereby rendering a calculation for correcting a reference level complicated, and the reliability of the calculation may be degraded.

However, when data once subjected to the NRZI precoding as explained before is recorded and reproduced, adjacent two information bits cannot have equal values such as (1, 1) or (−1, −1), and therefore, the amplitude at T/2 takes three values of ±½ and 0. Hence, if correction of a reference level is not carried out in case where T/2 may be 0 with a high probability, correction of a reference level can be properly carried out without being influenced by interferences between codes.

Application of the present invention is not limited to a digital VTR, but the present invention is, of course, applicable to other digital signal recording/reproducing apparatuses or a communication apparatus.

According to the above-mentioned first and second embodiments of the present invention, an error rate after decoding can be reduced to be low, and the reference level of decoding can be properly maintained against disturbances.

As has been described above, firstly according to the present invention, in course of recording/reproducing compression blocks compressed for every plurality of data pieces thereby to perform maximum likelihood decoding, maximum likelihood information which has been greatly changed due to a sudden fault like a dropout except for noise is initialized to a predetermined value for every one compression block or every plurality of compression blocks, so that the sudden fault can be completely prevented from influencing or transferring a next compression block. As a result, it is possible to realize a communication apparatus or a compression digital signal processing apparatus such as a digital VTR, a digital video disc, or the like which uses compression means, in which errors included in data after expansion of data can be remarkably reduced and a large quantity of data such as digital video signals and the likes can be transmitted/received or recorded/reproduced.

Secondly according to the present invention, an amplitude corresponding to an information bit is extracted from reproduction signals equalized along a predetermined equalization method, and another signal amplitude is extracted at a point which is close to the point where the former amplitude is extracted, with an interval shorter than an information bit interval being interposed between the two points. A change in frequency characteristic is immediately corrected by using a known correlation between the two amplitudes. As a result of this, it is possible to realize a maximum likelihood decoder which is not influenced by an immediate change in frequency, such as a spacing change shown in a digital VTR apparatus.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A digital signal decoding apparatus comprising:
   maximum-likelihood decoding means for maximum-likelihood decoding a digital signal consisting of compression block data obtained by compressing digital data for every plurality of digital data units, and for outputting a maximum-likelihood decoded digital signal;
   detection means for receiving the maximum-likelihood decoded digital signal from the maximum-likelihood decoding means, for detecting at least one compression block data unit, and for outputting a predetermined control signal; and
   initialization means for initializing maximum-likelihood information used for the maximum-likelihood decoding by the maximum-likelihood decoding means, to a predetermined value on the basis of the control signal outputted from the detection means.

2. A digital signal decoding apparatus according to claim 1, said maximum-likelihood decoding means including branch-metric calculation means for calculating a branch metric of the digital signal, pass-metric memory means for storing a predetermined pass metric used as the maximum-likelihood information, selection means for selecting a next pass-metric on the basis of the branch metric calculated by the branch-metric calculation means and the pass metric supplied from the pass-metric memory means, thereby to output remaining-pass information, and remaining-pass memory means for storing the remaining-pass information outputted from the selection means, wherein said initialization means initializes the pass metric stored in the pass-metric memory means.

3. A digital signal decoding apparatus according to claim 1, wherein said at least one compression block data unit includes specific additional information, and said detection means includes comparison determination means for comparing the maximum-likelihood decoded digital signal with the specific additional information, thereby to output the control signal in accordance with a comparison result obtained.

4. A digital signal decoding apparatus according to claim 3, wherein said specific additional information consists of a specific bit pattern and an arbitrary bit pattern, and said comparison determination means compares the maximum-likelihood digital signal with the specific bit pattern, thereby to output the control signal in accordance with a comparison result obtained.

5. A digital signal decoding apparatus according to claim 1, wherein said at least one compression block data unit includes specific additional information, and said detection means is included in block expansion means for expanding demodulated compression block data in units of blocks thereby to obtain an original digital signal after the decoded digital signal is demodulated, and detects a partition between compression blocks on the basis of the specific additional information.

6. A digital signal decoding apparatus according to claim 5, wherein said additional information consists of a specific bit pattern and an arbitrary bit pattern, and said detection means detects a partition between compression blocks on the basis of the specific bit pattern.

7. A digital signal decoding apparatus according to claim 2, further comprising an input buffer memory provided in a front stage before the maximum-likelihood decoding means and an output buffer memory provided in a rear stage after the maximum-likelihood decoding means, wherein said input buffer memory inputs again a portion of input data, which precedes by a predetermined time period, from an input information column stored in the branch-metric calculation means after outputting, into the branch-metric calculation means, and said output buffer memory does not store decoded data until decoded data which is decoded again is received from the remaining-pass memory means, so that the decoded data depending on an initialized pass metric is sequentially outputted.

8. A digital signal decoding method comprising:

a maximum-likelihood decoding step of maximum-likelihood decoding a digital signal consisting of compression block data obtained by compressing digital data for every plurality of digital data units, and of outputting a maximum-likelihood decoded digital signal;

a detection step of receiving the maximum-likelihood decoded digital signal decoded in the maximum-likelihood decoding step, of detecting at least one compression block data unit, and of outputting a predetermined control signal; and an initialization step of initializing maximum-likelihood information used for the maximum-likelihood decoding in the maximum-likelihood decoding step, to a predetermined value on the basis of the control signal.

9. A digital signal decoding method according to claim 8, said maximum-likelihood decoding step including a branch-metric calculation step of calculating a branch metric of the digital signal, a pass-metric memory step of storing a predetermined pass metric used as the maximum-likelihood information, a selection step of selecting a next pass-metric on the basis of the branch metric calculated in the branch-metric calculation step and the pass metric stored in the pass-metric memory step, thereby to output remaining-pass information, and a remaining-pass memory step of storing the remaining-pass information, wherein the pass metric stored is initialized in the initialization step.

10. A digital signal decoding method according to claim 8, wherein said at least one compression block data unit includes specific additional information, and said detection step includes a comparison determination step of comparing the maximum-likelihood decoded digital signal with the specific additional information, thereby to output the control signal in accordance with a comparison result obtained.

11. A digital signal decoding method according to claim 10, wherein said specific additional information consists of a specific bit pattern and an arbitrary bit pattern, and in said comparison determination step, the maximum-likelihood digital signal is compared with the specific bit pattern, thereby to output the control signal in accordance with a comparison result obtained.

12. A digital signal decoding method according to claim 8, wherein said at least one compression block data unit includes specific additional information, said detection step is included in a block expansion step of expanding demodulated compression block data in units of blocks, thereby to obtain an original digital signal after the decoded digital signal is demodulated, and a partition between compression blocks is detected in the detection step on the basis of the specific additional information.

13. A digital signal decoding method according to claim 12, wherein said additional information consists of a specific bit pattern and an arbitrary bit pattern, and in said detection step, a partition between compression blocks is detected on the basis of the specific bit pattern.

14. A digital signal decoding method according to claim 9, further comprising a step of inputting again a portion of input data, which precedes by a predetermined time period, from an input information column stored, after the branch-metric calculation step, thereby to calculate again the branch metric of the portion of input data, and of sequentially outputting decoded data depending on an initialized pass metric, by storing no decoded data until decoded data which is decoded again is received.

* * * * *